United States Patent
Chang

(10) Patent No.: US 12,057,171 B2
(45) Date of Patent: Aug. 6, 2024

(54) METHOD OF IMPROVING ENDURANCE OF NOR FLASH

(71) Applicant: Powerchip Semiconductor Manufacturing Corporation, Hsinchu (TW)

(72) Inventor: Wen-Yueh Chang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 304 days.

(21) Appl. No.: 17/834,912

(22) Filed: Jun. 7, 2022

(65) Prior Publication Data
US 2023/0360706 A1 Nov. 9, 2023

(30) Foreign Application Priority Data
May 6, 2022 (TW) .................................. 111117085

(51) Int. Cl.
*G11C 16/14* (2006.01)
(52) U.S. Cl.
CPC .................................. *G11C 16/14* (2013.01)
(58) Field of Classification Search
CPC ..... G11C 16/14; G11C 16/16; G11C 16/0416; G11C 16/3409; G11C 16/3477; G11C 16/3495
See application file for complete search history.

(56) References Cited

U.S. PATENT DOCUMENTS

| | | | |
|---|---|---|---|
| 6,049,486 A | 4/2000 | Lee et al. | |
| 6,330,190 B1 * | 12/2001 | Wang | H10B 69/00 257/E27.103 |
| 6,545,914 B2 | 4/2003 | Lee | |
| 6,847,556 B2 | 1/2005 | Cho | |
| 7,568,075 B2 | 7/2009 | Fujibayashi et al. | |
| 9,214,236 B2 | 12/2015 | Lue et al. | |
| 2003/0043633 A1 * | 3/2003 | Forbes | H01L 29/7881 257/E27.103 |
| 2003/0048666 A1 * | 3/2003 | Eldridge | H01L 29/511 257/E27.103 |
| 2013/0145085 A1 | 6/2013 | Yu et al. | |
| 2021/0151450 A1 | 5/2021 | Or-Bach et al. | |

OTHER PUBLICATIONS

Geon-Beom Lee et al., "Improved Self-Curing Effect in a MOSFET With Gate Biasing", IEEE Electron Device Letters, vol. 42, No. 12, Dec. 2021, pp. 1731-1734.
(Continued)

*Primary Examiner* — Mohammed A Bashar
(74) *Attorney, Agent, or Firm* — JCIPRNET

(57) ABSTRACT

A method of improving endurance of a NOR flash is provided. The NOR flash includes a substrate, a well formed in the substrate, a tunnel oxide layer, a floating gate, a dielectric layer, and a control gate sequentially stacked on the substrate, and a source and a drain formed in the well. The method includes the following steps. An erase time of the NOR flash is detected. In the case where the erase time exceeds a predetermined value, the source is brought into a floating state, a negative voltage is applied to the control gate, and a positive voltage is applied to the well to perform Joule heating on a drain side.

9 Claims, 2 Drawing Sheets

(56) References Cited

OTHER PUBLICATIONS

Hang-Ting Lue et al., "Radically Extending the Cycling Endurance of Flash Memory (to > 100M Cycles) by Using Built-in Thermal Annealing to Self-heal the Stress-induced Damage", 2012 International Electron Devices Meeting, Dec. 10-13, 2012, pp. 1-4.
"Notice of allowance of Taiwan Counterpart Application", issued on Oct. 27, 2022, p. 1-p. 4.

* cited by examiner

METHOD OF IMPROVING ENDURANCE OF NOR FLASH

CROSS-REFERENCE TO RELATED APPLICATION

This application claims the priority benefit of Taiwan application serial no. 111117085, filed on May 6, 2022. The entirety of the above-mentioned patent application is hereby incorporated by reference herein and made a part of this specification.

BACKGROUND

Technical Field

The disclosure relates to a flash memory technology, and more particularly, to a method of improving endurance of a NOR flash.

Related Art

Since a flash memory has the advantage that stored data does not disappear at power-off, it has become a widely used memory for a personal computer or other electronics equipment. The flash memory generally includes a substrate, a tunnel oxide layer, a floating gate, a dielectric layer, and a control gate sequentially stacked on the substrate, and a source and a drain.

The flash memory includes a NOR flash and a NAND flash. The NOR flash has a higher data reading speed and is programmed by hot electron injection, so that electrons tunnel through the floating gate; also, the NOR flash is erased by Fowler Nordheim tunneling (FN tunneling). However, after multiple program/erase cycles, electrons tend to trap in the tunnel oxide layer near the drain side and at the interface between the tunnel oxide layer and the substrate. The trapped electrons will cause a change in a threshold voltage VT and gradually narrow the memory window. As a result, the time required for erasing would gradually increase, and eventually the endurance of the NOR flash would deteriorate and the service life would decrease.

The conventional solution involves thermally annealing the overall semiconductor device including the flash memory, so that the trapped electrons in the tunnel oxide layer on the drain side and at the interface between the tunnel oxide layer and the substrate are removed. However, since the semiconductor device is generally already packaged, such a heating method often cannot reach the required high temperature due to the temperature limitation of the package material, and the overall efficiency is undesirable.

SUMMARY

The disclosure provides a method of improving endurance of a NOR flash which can effectively reduce electrons trapped in the interface traps and bulk traps in the NOR flash without affecting the package material and the interconnection in the semiconductor device, and can thereby improve the endurance and the service life of the NOR flash.

In a method of improving endurance of a NOR flash according to an embodiment of the disclosure, the NOR flash includes a substrate, a well formed in the substrate, a tunnel oxide layer, a floating gate, a dielectric layer, and a control gate sequentially stacked on the substrate, and a source and a drain disposed in the well. The method includes the following steps. An erase time of the NOR flash is detected. Joule heating is performed on a drain side in a case where the erase time exceeds a predetermined value. The Joule heating is performed by bringing the source into a floating state, applying a negative voltage to the control gate, and applying a positive voltage to the well.

In an embodiment of the disclosure, the Joule heating is performed for a duration longer than 1 second.

In an embodiment of the disclosure, the Joule heating is performed for a duration longer than 60 seconds.

In an embodiment of the disclosure, the well is a P-type doped region.

In an embodiment of the disclosure, the negative voltage is −2V.

In an embodiment of the disclosure, the negative voltage is less than −2V.

In an embodiment of the disclosure, the positive voltage is between 3V and 5V.

In an embodiment of the disclosure, a voltage of the drain is 0V.

In an embodiment of the disclosure, a temperature of the Joule heating is between 150° C. and 800° C.

Based on the above, in the method of improving endurance of the NOR flash of the disclosure, the required erase time is simultaneously detected in the program/erase process. In the case where the erase time exceeds a predetermined value, by performing Joule heating on the drain side, electrons trapped in the tunnel oxide layer near the drain side and at the interface between the tunnel oxide layer and the substrate are removed to improve the endurance of the NOR flash. Moreover, with Joule heating, other parts of the semiconductor device are heated lightly, so the interconnection in the semiconductor device or the overall package structure is not affected. As a result, the service life of the semiconductor device can be extended.

To make the aforementioned more comprehensible, several embodiments accompanied with drawings are described in detail as follows.

DESCRIPTION OF THE EMBODIMENTS

The description below provides multiple embodiments or examples for implementing different features of the disclosure. Moreover, these embodiments are only exemplary and are not intended to limit the scope and application of the disclosure. Furthermore, the relative dimensions (e.g., length, thickness, spacing, etc.) and relative positions of the regions or structural components may be reduced or exaggerated for clarity. Additionally, similar or identical reference signs used in different figures indicate similar or identical components or features.

Figure 1:
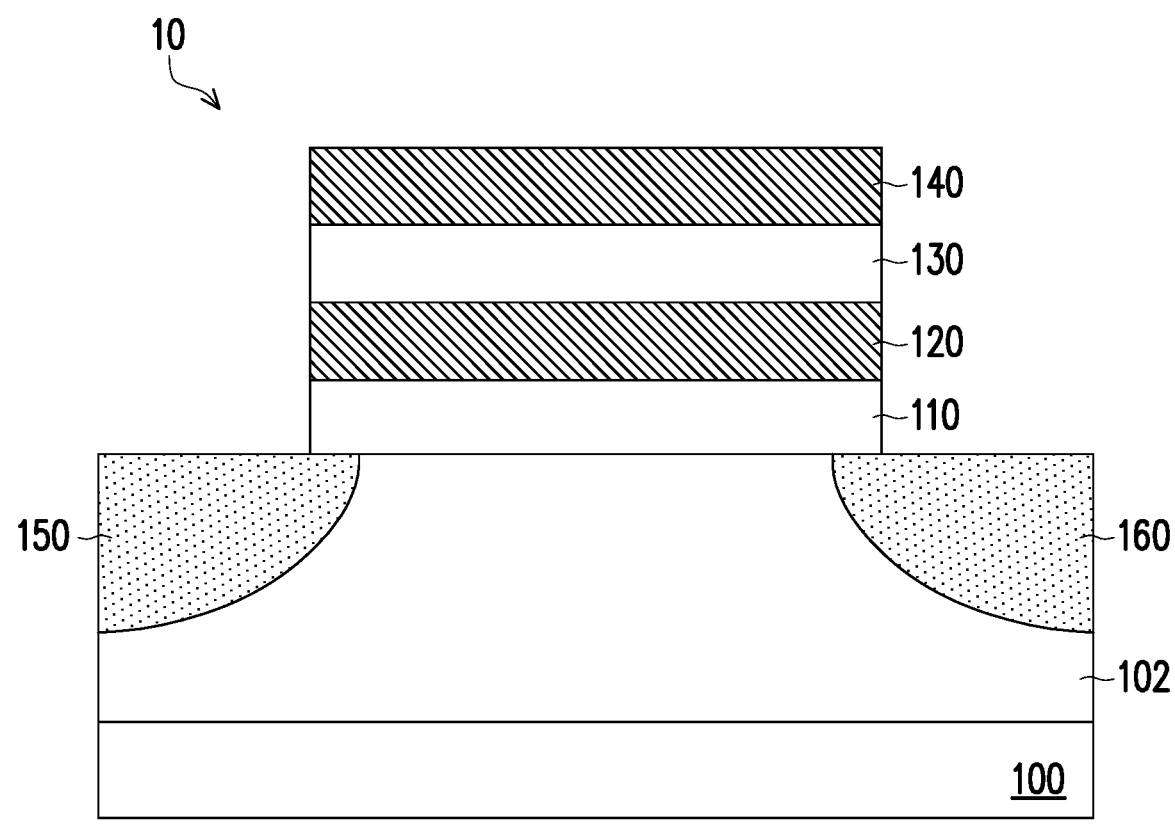
FIG. 1 is a schematic view of a NOR flash.
Figure 2:
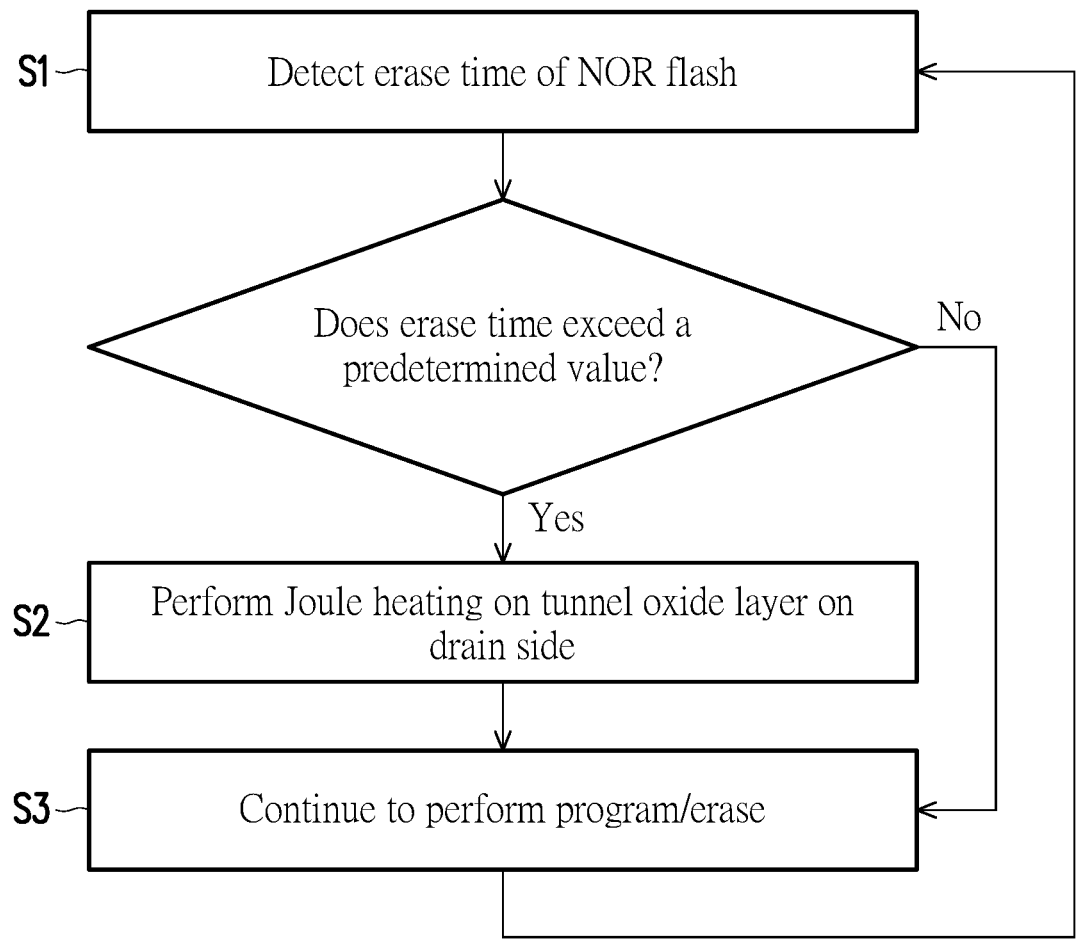
FIG. 2 is a flowchart showing steps of improving endurance of a NOR flash according to an embodiment of the disclosure.

FIG. 1 is a schematic view of a NOR flash. FIG. 2 is a flowchart showing steps of improving endurance of a NOR flash according to an embodiment of the disclosure.

Referring to FIG. 1, a NOR flash 10 includes a substrate 100, a well 102 formed in the substrate, a tunnel oxide layer 110, a floating gate 120, a dielectric layer 130, and a control gate 140 sequentially stacked on the substrate 100, and a source 150 and a drain 160 disposed in the well 102.

In this embodiment, the substrate 100 may be a semiconductor substrate, such as a silicon substrate. The well 102 may be a P-type well formed by doping a P-type dopant in the substrate 100 by ion implantation. The material of the tunnel oxide layer 110 may be a dielectric material, such as silicon oxide. The floating gate 120 may be a polysilicon layer. The dielectric layer 130 may be a single-layer structure or a multi-layer structure; for example, the dielectric layer 130 may be a composite layer composed of oxide/nitride/oxide (ONO). The control gate 140 may be a polysilicon layer. However, the disclosure is not limited thereto. In other embodiments, other suitable materials may be adopted as the materials of the above layers, and the manufacturing methods of the above layers may also involve the existing art, which shall not be repeatedly described herein.

Referring to FIG. 1 and FIG. 2 at the same time, a method of improving endurance of the NOR flash 10 includes the following steps. In step S1, in the program/erase process of the NOR flash 10, an erase time of the NOR flash 10 is simultaneously detected.

Next, in the case where the detected erase time exceeds a predetermined value, step S2 is executed; namely, the source 150 is brought into a floating state, a negative voltage is applied to the control gate 140, and a positive voltage is applied to the well 102 to perform Joule heating on the drain 160 side.

In this embodiment, the negative voltage applied to the control gate 140 may be −2V or less than −2V. The positive voltage applied to the well 102 may be, for example, 3V to 5V. However, the disclosure is not limited thereto. The above values of the negative voltage and the positive voltage may be changed according to the requirements. In some embodiments, the method of improving endurance of the NOR flash 10 further includes simultaneously causing the voltage of the drain to be 0V when the source 150 is brought into the floating state, the negative voltage is applied to the control gate 140, and the positive voltage is applied to the well 102.

When the source 150, the drain 160, the control gate 140, and the well 102 of the NOR flash are within the above voltage ranges, Joule heating can be performed on the junction between the well 102 and the drain 160, so that electrons trapped in the tunnel oxide layer 110 near the junction between the well 102 and the drain 160 and at the interface between the tunnel oxide layer 110 and the well 102 (substrate 100) move to the substrate 100, which prevents a problem that the accumulation of trapped electrons causes a change in a threshold voltage VT and thus increases the time required for erasing or even affects the endurance of the NOR flash 10.

Finally, step S3 is executed to continue to perform program/erase on the NOR flash 10. Then, the process returns to step S1 and is repeated continuously. In addition, in the case where the detected erase time is kept within the predetermined value, step S3 can be directly executed.

In this embodiment, by directly performing Joule heating on the drain 160 side inside the NOR flash 10, it is not required to additionally dispose a heating structure outside the NOR flash 10 or add additional steps. In addition, the disclosure only heats the drain 160 locally, and the improvement effect is better than the conventional approach of heating the entire flash memory to reduce the accumulation of electrons. Also, in the disclosure, once it is detected that the erase time of any segment in the flash memory exceeds a predetermined value, the above method of the disclosure will be executed immediately. Therefore, the service life of the NOR flash can be effectively extended and its endurance can be improved.

In summary of the above, in the method of improving endurance of the NOR flash of the disclosure, the required erase time is simultaneously detected in the program/erase process. In the case where the erase time exceeds a predetermined value, by performing Joule heating on the drain side, electrons trapped in the tunnel oxide layer near the drain side and at the interface between the tunnel oxide layer and the substrate are pulled to the substrate and no longer remained in the tunnel oxide layer or at the interface between the tunnel oxide layer and the substrate. As a result, the endurance of the NOR flash can be improved. Moreover, with Joule heating, other parts of the semiconductor device are heated lightly, so the interconnection in the semiconductor device or the overall package structure is not affected. As a result, the service life of the semiconductor device can be extended.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of improving endurance of a NOR flash, the NOR flash comprising a substrate, a well formed in the substrate, a tunnel oxide layer, a floating gate, a dielectric layer, and a control gate sequentially stacked on the substrate, and a source and a drain disposed in the well, the method comprising:
   detecting an erase time of the NOR flash; and
   performing Joule heating on a drain side in a case where the erase time exceeds a predetermined value, wherein the Joule heating is performed by bringing the source into a floating state, applying a negative voltage to the control gate, and applying a positive voltage to the well.

2. The method of improving endurance of a NOR flash according to claim 1, wherein the Joule heating is performed for a duration longer than 1 second.

3. The method of improving endurance of a NOR flash according to claim 1, wherein the Joule heating is performed for a duration longer than 60 seconds.

4. The method of improving endurance of a NOR flash according to claim 1, wherein the well is a P-type doped region.

5. The method of improving endurance of a NOR flash according to claim 1, wherein the negative voltage is −2V.

6. The method of improving endurance of a NOR flash according to claim 1, wherein the negative voltage is less than −2V.

7. The method of improving endurance of a NOR flash according to claim 1, wherein the positive voltage is between 3V and 5V.

8. The method of improving endurance of a NOR flash according to claim 1, wherein a voltage of the drain is 0V.

9. The method of improving endurance of a NOR flash according to claim 1, wherein a temperature of the Joule heating is between 150° C. and 800° C.

* * * * *